United States Patent
Park

(10) Patent No.: US 9,589,599 B2
(45) Date of Patent: Mar. 7, 2017

(54) TEMPERATURE COMPENSATED SEMICONDUCTOR DEVICE

(71) Applicant: Sk hynix Inc., Gyeonggi-do (KR)

(72) Inventor: Won-Sun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/812,852

(22) Filed: Jul. 29, 2015

(65) Prior Publication Data

US 2016/0301390 A1    Oct. 13, 2016

(30) Foreign Application Priority Data

Apr. 10, 2015  (KR) .................. 10-2015-0050904

(51) Int. Cl.
    *G11C 7/04*    (2006.01)

(52) U.S. Cl.
    CPC ..................... *G11C 7/04* (2013.01)

(58) Field of Classification Search
    CPC ....................................................... G11C 7/04
    See application file for complete search history.

(56) References Cited

U.S. PATENT DOCUMENTS

| 7,107,178 | B2 * | 9/2006 | Won | G01K 3/005 327/513 |
| 7,248,527 | B2 * | 7/2007 | Park | G11C 11/406 365/189.14 |
| 7,480,588 | B1 * | 1/2009 | Walker | G01K 7/425 702/132 |
| 8,140,293 | B2 * | 3/2012 | Jeong | G01K 7/425 702/117 |
| 8,217,779 | B2 * | 7/2012 | Kang | G06K 19/0716 340/10.1 |
| 8,220,992 | B2 * | 7/2012 | Hong | G11C 7/04 365/222 |
| 8,272,781 | B2 * | 9/2012 | Nale | G01K 7/425 374/1 |
| 8,452,463 | B2 * | 5/2013 | Cox | G06F 1/206 455/574 |
| 8,787,105 | B2 * | 7/2014 | Chen | G11C 11/40626 365/211 |
| 2006/0077742 | A1 * | 4/2006 | Shim | G11C 11/406 365/222 |
| 2008/0025729 | A1 * | 1/2008 | Funada | H04B 10/40 398/136 |
| 2009/0037778 | A1 * | 2/2009 | Resnick | G11C 7/04 714/48 |
| 2016/0054183 | A1 * | 2/2016 | Yayama | G01K 7/01 374/1 |

FOREIGN PATENT DOCUMENTS

| KR | 1020100049924 | 5/2010 |
| KR | 1020110001580 | 1/2011 |

* cited by examiner

*Primary Examiner* — Thomas J Hiltunen
(74) *Attorney, Agent, or Firm* — IP & T Group LLP

(57) ABSTRACT

An integrated circuit includes a first signal generation unit suitable for generating a first enable signal which is activated during an initial setting period; a second signal generation unit suitable for generating a second enable signal which is activated in response to a command for performing a preset operation, after the initial setting period; and a temperature code generation unit suitable for generating temperature codes in response to activation of the first and second enable signals.

14 Claims, 4 Drawing Sheets

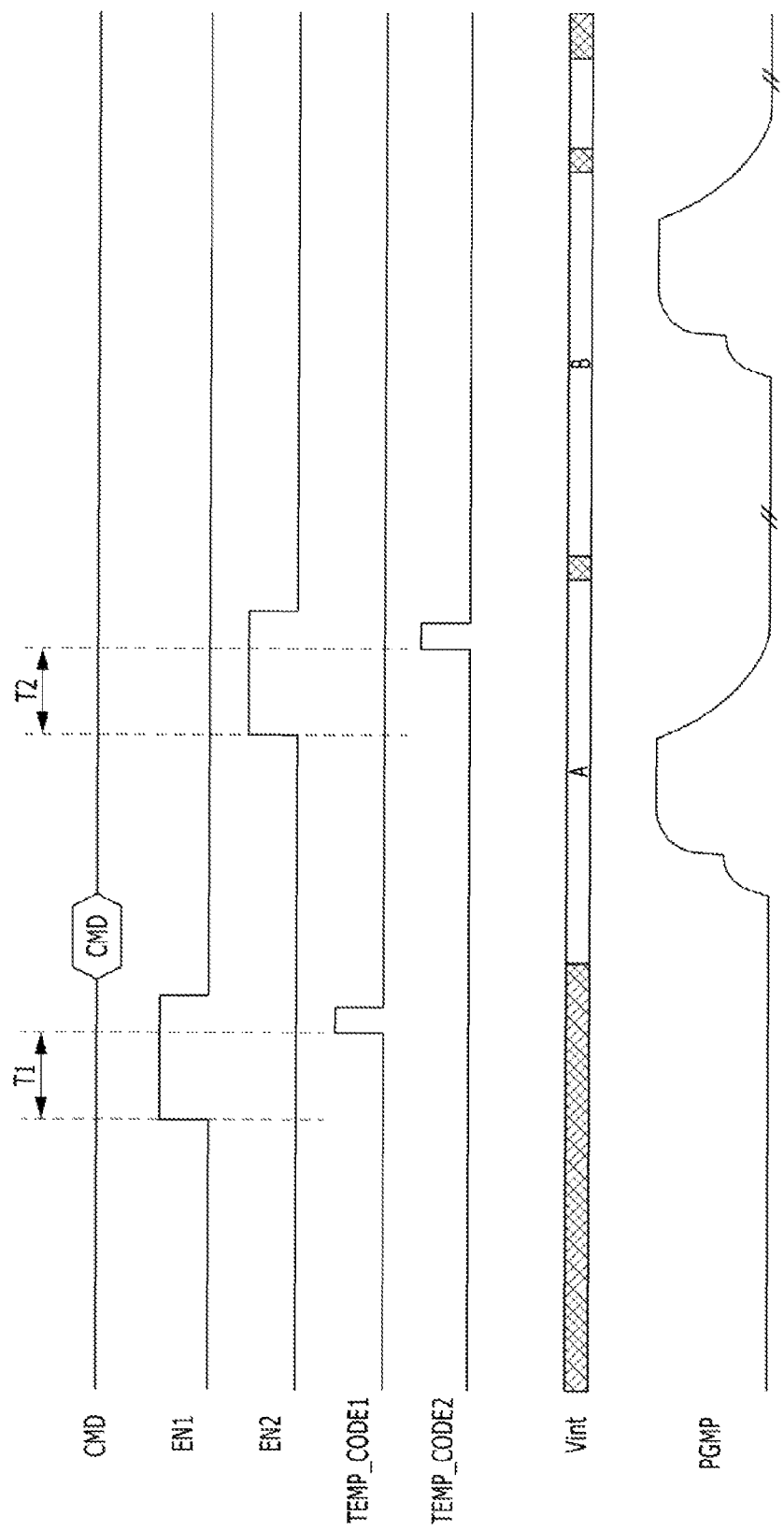

TEMPERATURE COMPENSATED SEMICONDUCTOR DEVICE

CROSS-REFERENCE TO RELATED APPLICATION

This application claims priority under 35 U.S.C. §119 to Korean Patent Application No. 10-2015-0050904 filed on Apr. 10, 2015 in the Korean Intellectual Property Office, the disclosure of which is incorporated herein by reference in its entirety.

BACKGROUND

1. Field

Exemplary embodiments of the present patent document relate to a semiconductor design technology and, more particularly, to an integrated circuit for sensing a temperature.

2. Description of the Related Art

More heat is generated in semiconductor devices as integration and operating speed increase. This generated heat causes a rise in temperature, changing operating characteristics and often resulting in negative performance or even operation failure. Therefore, there is a need to develop technologies for precisely sensing semiconductor device internal temperatures and compensating so that semiconductor device performance can be retained even with variations in temperature.

SUMMARY

Various embodiments are directed to an integrated circuit capable of compensating for temperature during a preset operation period.

In an embodiment, an integrated circuit may include: a first signal generation unit suitable for generating a first enable signal which is activated during an initial setting period; a second signal generation unit suitable for generating a second enable signal which is activated in response to a command for performing a preset operation, after the initial setting period; and a temperature code generation unit suitable for generating temperature codes in response to activations of the first and second enable signals.

The temperature code generation unit may include a temperature sensing unit suitable for sensing a temperature in response to the activations of each of the first and second enable signals; and an analog-to-digital conversion unit suitable for converting an output signal of the temperature sensing unit into the temperature codes.

In an embodiment, a semiconductor device may include: a signal generation unit suitable for generating first and second enable signals corresponding to first and second operation periods, respectively; a temperature code generation unit suitable for generating first and second temperature codes by sensing a temperature in response to activations of the first and second enable signals respectively; a latch unit suitable for storing the first and second temperature codes; a comparison unit suitable for comparing the first and second temperature codes outputted from the latch unit, in response to the second enable signal; a voltage control unit suitable for controlling an internal voltage in response to a comparison signal outputted from the comparison unit; and an internal circuit suitable for performing an internal operation in response to the internal voltage.

The signal generation unit may include a first signal generation unit suitable for generating the first enable signal which is activated during the first operation period; and a second signal generation unit suitable for generating the second enable signal which is activated in response to a command for performing a preset operation, during the second operation period after the first operation period.

The first operation period may correspond to an initial setting period.

The temperature code generation unit may include temperature sensing unit suitable for sensing the temperature in response to the activations of each of the first and second enable signals; and an analog-to-digital conversion unit suitable for converting an output signal of the temperature sensing unit into the first and second temperature codes.

The voltage control unit may include an adjusting unit suitable for outputting an offset voltage corresponding to one of the first and second temperature codes in response to the comparison signal.

The voltage control unit may further include a reference voltage generation unit suitable for generating a reference voltage in response to an operation mode signal; and an adding unit suitable for adding the offset voltage to the reference voltage.

The internal circuit may perform a program operation in response to the internal voltage.

The internal circuit may perform an erase operation in response to the internal voltage.

In an embodiment, a method for operating a semiconductor device may include: setting an internal voltage based on a first temperature during an initial setting period; activating an enable signal in response to a command for performing a preset operation, after the initial setting period; resetting the internal voltage based on a second temperature in response to the enable signal; and performing the preset command operation in response to the internal voltage.

The performing of the preset command operation may include performing a first command operation in response to the internal voltage set based on the first temperature; and performing a second command operation in response to the internal voltage reset based on the second temperature.

The activating of the enable signal may be performed between the first command operation and the second command operation.

The resetting of the internal voltage may include comparing the first temperature with the second temperature to output a comparison signal; determining whether to reset the internal voltage, in response to the comparison signal; and adjusting the internal voltage based on a determination result.

The method may further include performing a program operation in response to the internal voltage.

The method may further include performing an erase operation in response to the internal voltage.

In the embodiments of this invention, since temperature compensation may be implemented many times during a preset operation period, changes in chip characteristics that occur due to temperature variations may be compensated for or prevented.

BRIEF DESCRIPTION OF THE DRAWINGS

FIG. 4 is a timing diagram explaining an operation of the semiconductor device shown in FIG. 3.

DETAILED DESCRIPTION

Various embodiments will be described below in more detail with reference to the accompanying drawings. The present invention may, however, be embodied in different various forms and should not be construed as limited to the embodiments set forth herein. Rather, these embodiments are provided so that the present disclosure will be thorough and complete, and will fully convey the scope of the invention to those skilled in the art.

Figure 1:
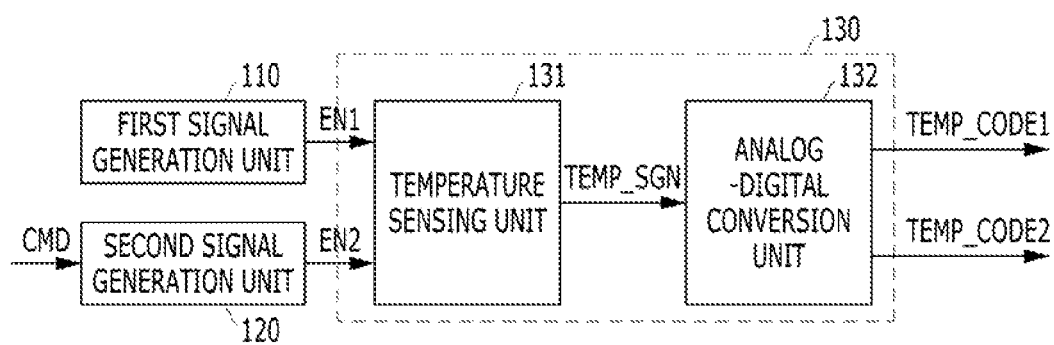
FIG. 1 is a block diagram illustrating a temperature sensing circuit in accordance with an embodiment.

FIG. 1 is a block diagram illustrating a temperature sensing circuit in accordance with an embodiment.

Referring to FIG. 1, the temperature sensing circuit may include a first signal generation unit 110, a second signal generation unit 120, and a temperature code generation unit 130.

The first signal generation unit 110 may generate a first enable signal EN1 which is activated during an initial setting period. The first enable signal EN1 may be used to sense a temperature during the initial setting period, and the initial setting period may be a period for setting an internal voltage before a command CMD for performing a preset operation is inputted.

The second signal generation unit 120 may generate a second enable signal EN2 which is activated in response to the command CMD for performing the preset operation, during a command operation period after the initial setting period. The second enable signal EN2 may be used to sense a temperature during the command operation period. The preset operation may be a program operation, an erase operation, a read operation, and/or a program verification operation, in response to the command CMD.

Although it is described as an example that a temperature sensing operation is performed only once during the command operation period in response to the second enable signal EN2 in the temperature sensing circuit, it is to be noted that a temperature sensing operation may be repeated many times during the command operation period.

The temperature code generation unit 130 may include a temperature sensing unit 131 and an analog-to-digital conversion unit 132.

The temperature sensing unit 131 may sense a temperature in response to an activation time of each of the first enable signal EN1 and the second enable signal EN2.

The analog-to-digital conversion unit 132 may convert an analog signal TEMP_SGN corresponding to the temperature outputted from the temperature sensing unit 131, into first and second temperature codes TEMP_CODE1 and TEMP_CODE2. The first temperature code TEMP_CODE1 corresponds to the temperature sensed during the activation time of the first enable signal EN1, and the second temperature code TEMP_CODE2 corresponds to the temperature sensed in response to the activation time of the second enable signal EN2.

In summary, the temperature sensing circuit may sense the temperature during the initial setting period before starting a command operation corresponding to the command CMD, and during the command operation period corresponding to the command operation. In the conventional art, since a temperature sensing operation is performed during only an initial setting period and an internal voltage is set before a command operation, the internal voltage is retained during a command operation period. Therefore, even when temperature varies during the command operation period or the internal voltage fluctuates due to changing temperatures, an operation is performed without compensation, resulting in an operation failure. However, in the embodiments of the present invention, since temperature may be sensed during the command operation period, the operation may be performed with an internal voltage that is updated based on a changing temperature.

Figure 2:
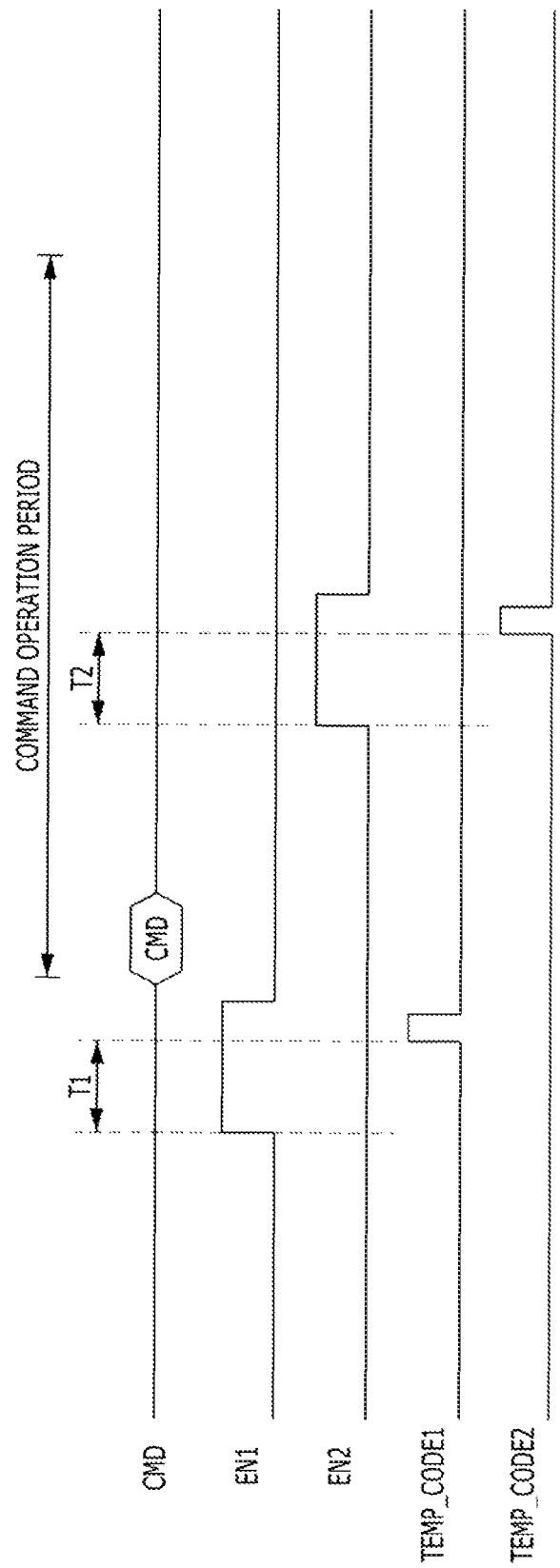
FIG. 2 is a timing diagram explaining an operation of the temperature sensing circuit shown in FIG. 1.

FIG. 2 is a timing diagram explaining an operation of the temperature sensing circuit shown in FIG. 1.

Referring to FIGS. 1 and 2, the first signal generating unit 110 outputs the first enable signal EN1 which is activated during the initial setting period. The temperature sensing unit 131 may sense a temperature during a first period T1 in response to the first enable signal EN1, and the analog-to-digital conversion unit 132 may generate the first temperature code TEMP_CODE1 which corresponds to the sensed temperature. For example, a semiconductor device may initially set an internal voltage to be used in the command operation corresponding to the command CMD, in response to the first temperature code TEMP_CODE1.

During the command operation period in which the command CMD is inputted and the command operation is performed, when the second enable signal EN2 generated from the second signal generation unit 120 is activated, the temperature sensing unit 131 may sense a temperature during a second period T2, and the analog-to-digital conversion unit 132 may generate the second temperature code TEMP_CODE2 corresponding to the sensed temperature. For example, the semiconductor device may reset the initially set internal voltage to be used in the command operation corresponding to the command CMD, in response to the second temperature code TEMP_CODE2.

In summary, the temperature sensing circuit may initially set the internal voltage by sensing a temperature once before the command operation corresponding to the command CMD, and then, may sense a temperature once more during a period in which the command operation corresponding to the command CMD is performed and update the initially set internal voltage to optimize the command operation corresponding to the command CMD.

Figure 3:
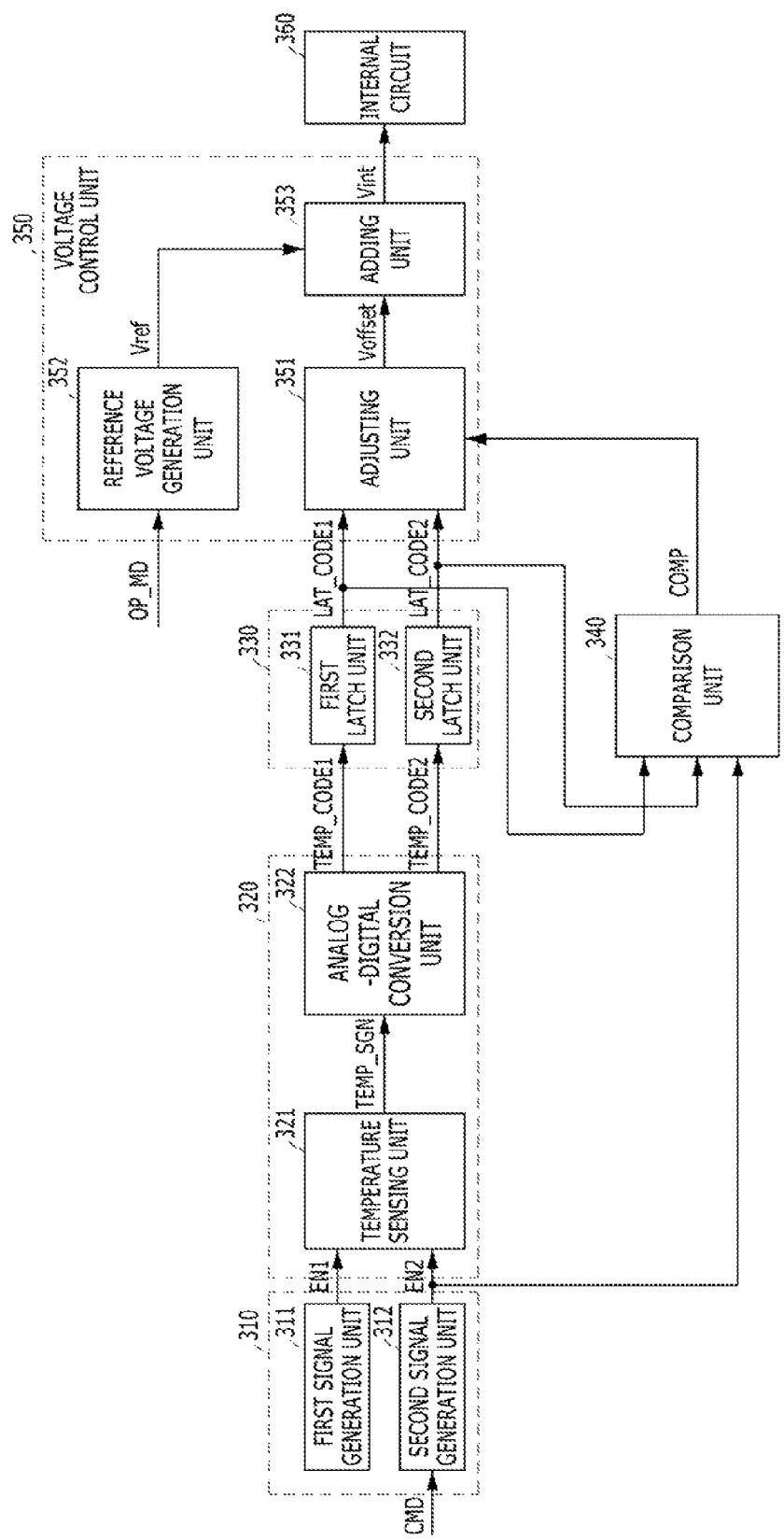
FIG. 3 is a block diagram illustrating a semiconductor device in accordance with an embodiment.

FIG. 3 is a block diagram illustrating a semiconductor device according to an embodiment.

Referring to FIG. 3, the semiconductor device may include a signal generation unit 310, a temperature code generation unit 320, a latch unit 330, a comparison unit 340, a voltage control unit 350, and an internal circuit 360.

The signal generation unit 310 may include first and second signal generation units 311 and 312. The configurations and operations of the first and second signal generation units 311 and 312 correspond to those of the first and second signal generation units 110 and 120 shown in FIG. 1, and the configuration and operation of the temperature code generation unit 320 correspond to those of the temperature code generation unit 130 shown in FIG. 1. Therefore, detailed descriptions thereof will be omitted.

The latch unit 330 may include first and second latch units 331 and 332. The first latch unit 331 may store a first temperature code TEMP_CODE1 as a temperature code which corresponds to a temperature sensed at an activation time of a first enable signal EN1 outputted from the first signal generation unit 311, and the second latch unit 332 may store a second temperature code TEMP_CODE2 as a temperature code which corresponds to a temperature sensed at an activation time of a second enable signal EN2 outputted from the second signal generation unit 312.

The comparison unit 340 may compare a first code signal LAT_CODE1 outputted from the first latch unit 331 with a second code signal LAT_CODE2 outputted from the second latch unit 332 in response to the second enable signal EN2, and output a comparison signal COMP in response to whether the first code signal LAT_CODE1 and the second code signal LAT_CODE2 are the same.

The voltage control unit 350 may include an adjusting unit 351, a reference voltage generation unit 352, and an adding unit 353.

The adjusting unit 351 may output an offset voltage Voffset corresponding to the first code signal LAT_CODE1 or the second code signal LAT_CODE2 in response to the comparison signal COMP. That is, in response to the comparison signal COMP generated as a result of comparing the first code signal LAT_CODE1 with the second code signal LAT_CODE2, respectively inputted as a previous temperature code and a current temperature code due to a time difference, the adjusting unit 351 may output the offset voltage Voffset corresponding to the first code signal LAT_CODE1 when the first code signal LAT_CODE1 and the second code signal LAT_CODE2 are the same, and may output the offset voltage Voffset corresponding to the second code signal LAT_CODE2 when the first code signal LAT_CODE1 and the second code signal LAT_CODE2 are different.

The reference voltage generation unit 352 may generate a reference voltage Vref to be used in a corresponding operation mode, in response to an operation mode signal OP_MD. The operation mode signal OP_MD may be a mode signal which is generated in response to a command CMD for performing a preset operation.

The adding unit 353 may add the offset voltage Voffset which is outputted from the adjusting unit 351 and corresponds to the current temperature, to the reference voltage Vref which is outputted from the reference voltage generation unit 352 and corresponds to the corresponding operation mode, and finally output an internal voltage Vint for performing a command operation.

In summary, the adjusting unit 351 may output the offset voltage Voffset corresponding to the first code signal LAT_CODE1 in order to initially set the internal voltage Vint during an initial setting period. The adding unit 353 may add the offset voltage Voffset outputted from the adjusting unit 351 to the reference voltage Vref outputted from the reference voltage generation unit 352 and corresponding to the corresponding operation mode, and set the internal voltage Vint. In other words, the semiconductor device may generate the first code signal LAT_CODE1 in response to the first enable signal EN1, and generate the internal voltage Vint corresponding to the first code signal LAT_CODE1.

Thereafter, when the second enable signal EN2 is activated during a command operation period in which the command operation is performed, the semiconductor device may generate the second code signal LAT_CODE2 corresponding to the temperature at the activation time of the second enable signal EN2, from the temperature code generation unit 320 and the second latch unit 332. By comparing the first code signal LAT_CODE1 inputted previously, i.e., during the initial setting period, with the recently inputted second code signal LAT_CODE2, i.e., during the command operation period, the adjusting unit 351 may output the offset voltage Voffset corresponding to the first code signal LAT_CODE1 when they are the same, and output the offset voltage Voffset corresponding to the second code signal LAT_CODE2 when they are different. Accordingly, it is possible to reset the internal voltage Vint corresponding to the current temperature even while performing the command operation.

The command CMD may be a command for performing one operation among a program operation, an erase operation, a read operation and a program verification operation.

The internal voltage Vint may be differently set in response to the command CMD. For example, when the command CMD is a command for performing the program operation, the internal voltage Vint may be a bias voltage which is applied to a drain select line (DSL). When the command CMD is a command for performing the erase operation, the internal voltage Vint may be a bias voltage which is applied to a source line (SL). When the command CMD is a command for performing the read operation and the program verification operation, the internal voltage Vint may be a pass voltage and a verification voltage.

The internal circuit 360 may perform an internal operation in response to the internal voltage Vint. For example, the internal circuit 360 may perform the program operation in response to the internal voltage Vint, or the internal circuit 360 may perform the erase operation in response to the internal voltage Vint.

Although in example in FIG. 3 the internal voltage Vint is compensated for by sensing a temperature once in response to the second enable signal EN2 during the command operation period corresponding to the command CMD, it is to be noted that it is possible to compensate for the internal voltage Vint by sensing temperature many times during the command operation period.

FIG. 4 is a timing diagram explaining an operation of the semiconductor device shown in FIG. 3.

Referring to FIGS. 3 and 4, the semiconductor device may receive the command CMD from outside, and perform an operation corresponding thereto. It will be described as an example with reference to FIG. 4 that the command CMD for a program operation is received, and accordingly, when a program pulse PGMP is activated, the program operation may be performed.

The first signal generation unit 311 outputs the first enable signal EN1 which is activated during the initial setting period. The temperature sensing unit 321 may sense a temperature during a first period T1 in response to the first enable signal EN1, the analog-to-digital conversion unit 322 may generate a first temperature code TEMP_CODE1 corresponding to the sensed temperature, and the first latch unit 331 may store the first code signal LAT_CODE1. Thereafter, the voltage control unit 350 may output the internal voltage Vint corresponding to the first code signal LAT_CODE1. A first internal voltage A of the internal voltage Vint may be an initial voltage corresponding to the temperature sensed during the first period T1, i.e., the initial setting period. Accordingly, the program operation may be performed in response to the program pulse PGMP which is generated by using the first internal voltage A.

Subsequently, the second signal generation unit 312 may output the second enable signal EN2 which is activated after a given time, while the program operation is performed. The temperature sensing unit 321 may sense a temperature during a second period T2 in response to the second enable signal EN2, the analog-to-digital conversion unit 322 may generate a second temperature code TEMP_CODE2 corresponding to the sensed temperature, and the second latch unit 332 may store the second code signal LAT_CODE2. Then, by comparing the first code signal LAT_CODE1 with the second code signal LAT_CODE2, the voltage control unit 250 may output the previously set internal voltage, i.e., the first internal voltage A, as it is, when they are the same, and may reset and output the internal voltage Vint corresponding to the second code signal LAT_CODE2 when they are different. Namely, a second internal voltage B, which is a bias voltage corresponding to the temperature sensed during the program operation, may be set based on a result of comparing the first and second code signals LAT_CODE1 and LAT_CODE2. In response to the second internal voltage B reset in this way, the program operation may be performed continuously.

In summary, the memory device may initially set an internal voltage by sensing a temperature at a corresponding time during an initial setting period. Thereafter, during a command operation period after an external command CMD for performing a preset operation, for example, a command CMD for performing a program operation, an erase operation, a read operation, a program verification operation, and so forth, is inputted, the memory device may sense a temperature at least one time and reset the internal voltage in response to a result of comparing a previous temperature with a current temperature. As a consequence, it is possible to perform a control task such that the characteristics of the chip are not changed according to temperature variation.

The present invention described above will not be limited by the above described embodiments and the accompanying drawings and it will be apparent to those skilled in the art that various substitutions, variations and changes may be made without departing from the spirit and scope of the invention as defined in the following claims.

What is claimed is:

1. A semiconductor device comprising:
   a signal generation unit configured to generate first and second enable signals corresponding to first and second operation periods, respectively;
   a temperature code generation unit configured to generate first and second temperature codes by sensing a temperature in response to activations of the first and second enable signals, respectively;
   a latch unit configured to store the first and second temperature codes;
   a comparison unit configured to compare the first and second temperature codes outputted from the latch unit, in response to the second enable signal;
   a voltage control unit configured to control an internal voltage in response to a comparison signal outputted from the comparison unit; and
   an internal circuit configured to perform an internal operation in response to the internal voltage.

2. The semiconductor device of claim 1, wherein the signal generation unit comprises:
   a first signal generation unit configured to generate the first enable signal which is activated during the first operation period; and
   a second signal generation unit configured to generate the second enable signal which is activated in response to a command for performing a preset operation, during the second operation period after the first operation period.

3. The semiconductor device of claim 2, wherein the first operation period corresponds to an initial setting period.

4. The semiconductor device of claim 1, wherein the temperature code generation unit comprises:
   a temperature sensing unit configured to sense the temperature in response to the activations of each of the first and second enable signals; and
   an analog-to-digital conversion unit configured to convert an output signal of the temperature sensing unit into the first and second temperature codes.

5. The semiconductor device of claim 1, wherein the voltage control unit comprises:
   an adjusting unit configured to output an offset voltage corresponding to one of the first and second temperature codes in response to the comparison signal.

6. The semiconductor device of claim 5, wherein the voltage control unit further comprises:
   a reference voltage generation unit configured to generate a reference voltage in response to an operation mode signal; and
   an adding unit configured to add the offset voltage to the reference voltage.

7. The semiconductor device of claim 1, wherein the internal circuit performs a program operation in response to the internal voltage.

8. The semiconductor device of claim 1, wherein the internal circuit performs an erase operation in response to the internal voltage.

9. A method of operating a semiconductor device, the method comprising:
   setting an internal voltage based on a first temperature during an initial setting period;
   activating an enable signal in response to a command for performing a preset operation, after the initial setting period;
   resetting the internal voltage based on a second temperature in response to the enable signal; and
   performing the preset operation in response to the internal voltage.

10. The method of claim 9, wherein the performing of the preset command operation comprises:
    performing a first command operation in response to the internal voltage set based on the first temperature; and
    performing a second command operation in response to the internal voltage reset based on the second temperature.

11. The method of claim 10, wherein the activating of the enable signal is performed between the first command operation and the second command operation.

12. The method of claim 9, wherein the resetting of the internal voltage comprises:
    comparing the first temperature with the second temperature to output a comparison signal;
    determining whether to reset the internal voltage, in response to the comparison signal; and
    adjusting the internal voltage based on a determination result.

13. The method of claim 9, further comprising:
    performing a program operation in response to the internal voltage.

14. The method of claim 9, further comprising:
    performing an erase operation in response to the internal voltage.

* * * * *